United States Patent [19]
Bingham

[11] Patent Number: 5,168,250
[45] Date of Patent: Dec. 1, 1992

[54] BROADBAND PHASE SHIFTER AND VECTOR MODULATOR

[75] Inventor: Steven D. Bingham, Valrico, Fla.

[73] Assignee: E-Systems, Inc., St. Petersburg, Fla.

[21] Appl. No.: 716,387

[22] Filed: Jun. 17, 1991

[51] Int. Cl.$^5$ .............................................. H03H 7/20
[52] U.S. Cl. ..................... 333/139; 333/164; 307/511; 307/571
[58] Field of Search ............... 333/138, 139, 140, 156, 333/160, 164; 330/54, 286, 277; 307/571, 511, 262; 328/55, 56

[56] References Cited

U.S. PATENT DOCUMENTS

| | | | |
|---|---|---|---|
| 2,923,891 | 2/1960 | Nicholson, Jr. | 332/146 |
| 3,386,052 | 5/1968 | Thomas | 332/146 |
| 3,817,582 | 6/1974 | Green et al. | 307/262 |
| 4,511,813 | 4/1985 | Pan | 307/501 |
| 4,524,336 | 6/1985 | Franke | 332/144 |
| 4,549,152 | 10/1985 | Kumar | 333/156 |
| 4,595,881 | 6/1986 | Kennan | 330/277 X |
| 4,638,190 | 1/1987 | Hwang et al. | 307/512 |
| 4,733,203 | 3/1988 | Ayasli | 333/139 |
| 4,893,035 | 1/1990 | Reynolds et al. | 333/164 X |
| 5,021,756 | 6/1991 | Tajima et al. | 330/54 X |

OTHER PUBLICATIONS

E. Strid, "A Monolithic 10-GHz Vector Modulator", 1983 IEEE GaAs IC Symposium, pp. 109–112.

Primary Examiner—Eugene R. Laroche
Assistant Examiner—Seung Ham
Attorney, Agent, or Firm—Harold E. Meier

[57] ABSTRACT

A broadband phase shifter and vector modulator includes two artificial transmission lines interconnected by FETs to selectively produce and sum incremental phase shifts of an input signal. A number of low pass filter sections are connected in series to form the first of the two artificial transmission lines and a number of high pass filter sections are connected in series to form the second artificial transmission line. Use of low pass and high pass filters equalizes transit times of each phasor through the phase shifter so as to maintain the proper phase relationship between the phasors over a broad bandwidth. Each of the two artificial transmission lines are coupled to a transistor circuit connecting corresponding low and high pass filter sections. The phase shifter operates by selectively summing the output variable-amplitude phase-shifted signals generated within the transmission lines to produce an output signal having a phase shift between 0° and 360°.

13 Claims, 3 Drawing Sheets

BROADBAND PHASE SHIFTER AND VECTOR MODULATOR

BACKGROUND OF THE INVENTION

As is well known, a periodic signal has a frequency, a magnitude and a phase. When analyzing periodic signals, the amplitude and phase of the signal is, for mathematical convenience, represented by a phase vector, called a phasor, that rotates about an origin. The angle of the phasor with respect to a reference indicates the phase of a signal at a particular time, and its length or magnitude indicates the amplitude of the signal. In view of this phasor representation, periodic signals are often spoken of in the art as "vectors," and the process of phase shifting periodic signals is commonly referred to as "vector modulation". In the following description, as in the art, the term "vector" refers both to actual periodic signals as well as to an abstract mathematical representation of periodic signals.

Vector analysis of periodic signals demonstrates several concepts important to understanding the present invention. When, for example, two or more signals are summed, the amplitude and phase of the resulting signal may be determined by adding the vectors of the phasors of each signal. This vector representation of summed signals thus suggests a common method of vector modulation or phase shifting referred to as a variable amplitude phasor approach. In this approach, an output signal having a given phase shift may be generated by properly splitting and shifting the input signal and summing the two resulting split signals. For example, equally splitting an input signal into two identical signals, shifting one by 90° and the other by 180°, and adding the two delayed signals produces the input signal phase shifted by 135°. In this example, by varying the amplitude of one of the signals, thereby varying the length (magnitude) of its vector representation, the input signal can be phase shifted through all the angles between 90° and 180°.

Although phase shifters and vector modulators have a wide range of uses, one important use is in steering a beam of phased array antenna. A phased array antenna is comprised of a plurality of antenna elements, each of which receives signals identical in almost every respect except for their phases. A phased array antenna generates a beam in a given direction by constructively combining radiation emitted from each individual antenna element. To steer the beam, the phases of the signals applied to each element are appropriately shifted by phase shifters. Accurately pointing the beam and, at the same time, suppressing radiation sidelobes depends on accurately controlling the phase shifts between antenna elements.

In a paper entitled "A Monolithic 10-GHz Vector Modulator", published by the IEEE in 1983 as part of its GaAs IC Symposium, Eric W. Strid describes a phase controller (hereinafter referred to as the "Strid vector modulator") that is monolithically implemented as a single integrated circuit utilizing the variable amplitude phasor approach. This single integrated circuit is small and light, and therefore has the advantage of being usable with phased array antennas on moving platforms such as military aircraft and spacecraft.

The circuit of the Strid vector modulator includes a first and a second tapped lumped delay line. The delay lines are like those used by a transversal filter for matched filter detection of PCM signals. The periodic signal to be selectively phase shifted is applied to an input of one of the delay lines. Each delay line is comprised of a number of series connected signal delayers to generate phase shifts. The amount of delay between each signal delayer in the delay lines is chosen such that the phase of a periodic signal at a center frequency in the band of interest is delayed by 90° or 120° for each delayer as the signal propagates through each delay line. A plurality of field effect transistors (FETs), connect each delayer of the first delay line to a corresponding delayer on the second delay line.

The paths through the delay elements and the FETs form a number of vector channels. Each vector channel provides to the outputs of the Strid vector modulator variably phase shifted versions of the input signal for summing. The signal generated by each vector channel differs in phase by a predetermined amount, usually in increments of 90° or 120°. By turning the FETs "on" and "off" and adjusting the amplitude of the applied voltage to each FET, different vectors of differing magnitudes and phases may be created and added to vary and control the phase shift of the input signal. Therefore, the Strid vector modulator functions as an analog phase shifter capable of producing any angle between 0° and 360°.

The Strid vector modulator satisfies many requirements for phase shifters used for phased array antennas aboard moving platforms, namely that the vector modulators be small and light, and consume little power. However, the vector modulation bandwidth of the Strid vector modulator is severely narrow, especially for signals in the microwave range, as a result of the utilization of signal delayers for creating phase shifts.

At a given center frequency the vectors of the periodic signal in each of the four vector channels are separated by the required 90° of phase shift. However, use of frequency dependant signal delayers to generate phase shifts results in different transit times through the vector channels for different frequencies of the input signal. Thus, deviations in the input frequency causes skewing of the frequency versus phase response of the Strid vector modulator resulting in phase distortion in the output signal. As the frequency of the input periodic signal applied to a Strid vector phase modulator deviates from the center frequency, the angles between the vectors of the signal samples begin to deviate and drift substantially and are no longer fixed at 90° apart.

When used in conjunction with phased array antennas, the Strid vector modulator introduces intolerable phase errors and distortions in the signal that seriously effect array beam pointing accuracy and the suppression of array side lobe radiation. The Strid phase shifter is, therefore, unsuitable for use in highly accurate phased array antennas transmitting broadband periodic signals.

It is theoretically possible to correct the Strid phase errors and distortions by varying the applied FET voltage as the frequency of the vector modulator input signal changes. However, aside from the impracticality of dynamically adjusting the amplification of the FETs as a function of input signal frequency variation, the extra circuitry and complexity required to provide adjustable FET amplification to correct the resulting phase distortions of the Strid device leads away from the goals of a small, simple, low power device capable of monolithic implementation to achieve reproducible performance and mass production.

Accordingly, there is a need for a small, simple, low power vector modulator having consistent broadband frequency response further capable of being implemented on a monolithic chip.

BRIEF DESCRIPTION OF THE INVENTION

The present invention is an improvement of the Strid analog vector modulator. It is, unlike Strid, truly broadband, sweeping all angles from 0° to 360° over broad bandwidths of the input periodic signal without severe phase distortion, especially in the microwave frequency range. Yet, the broadband phase shifter of the present invention preserves many of the advantages offered by the Strid vector modulator, including simple circuitry and small size, even at low frequencies, and possible monolithic implementation advantages such as even smaller size, lightweight packaging, mass production and reproducible performance.

In place of the parallel lumped delay lines of the Strid vector modulator, the invention utilizes a first and second parallel artificial transmission line coupled by field effect transistors (FETs). The first artificial transmission line is comprised of low pass filters connected in series, each low pass filter retarding the phase or vector of an input signal by minus 45°. The second artificial transmission line is comprised of high pass filters connected in series, each high pass filter advancing the vector of the sampled input signal by 45°. Like the Strid vector modulator, vector generating channels are established by turning "on" and "off" the FETs interconnecting the low pass and high pass filters so as to generate vectors having angles of 0°, 90°, 180° and 270°.

Unlike the Strid vector modulator however, where the lumped delay lines introduced different transit times through each vector channel, the low pass and high pass filters utilized by the present invention on, respectively, the gates and drains of the FETs equalize path lengths and transit times through each vector generating channel with variations in frequency of the input periodic signal. The bandwidth of the device is therefore limited only by the roll-off frequency characteristics of the filters, rather than by the narrow band frequency response characteristic of signal delayers. Vectors generated by the present invention therefore have a relatively flat phase versus frequency response over a broad bandwidth, the vectors remaining spaced apart by 90°.

Furthermore, the invention takes advantage of the parasitic capacitance associated with the gates of the FETs by incorporating that capacitance into each low pass filter structure on the first artificial transmission line. The number of components and complexity of the filter are thereby reduced. In addition, utilization of artificial transmission lines for the vector modulator in accordance with the present invention has better than a 20 dB return loss over a broad bandwidth.

BRIEF DESCRIPTION OF THE DRAWINGS

A more complete understanding of the present invention and its advantages may be had by reference to the foregoing Background of the Invention and the following Detailed Description, both taken in conjunction with the accompanying Drawings wherein.

DETAILED DESCRIPTION OF THE DRAWINGS

Figure 1:
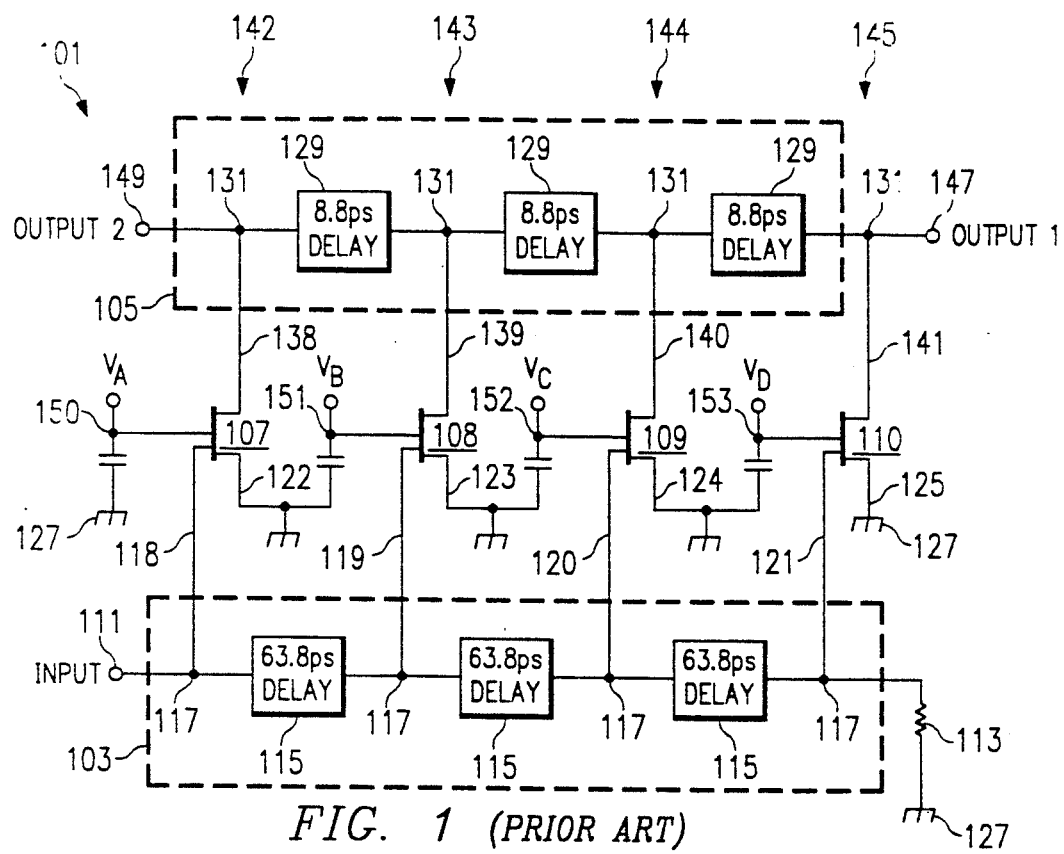
FIG. 1 is a schematic diagram of a prior art Strid vector modulator.

Referring now to FIG. 1, there is shown a schematic diagram of the prior art Strid phase shifting vector modulator 101. As can be readily seen, the prior art vector modulator 101 is comprised of a first and second delay line, 103 and 105 respectively, interconnected by a number of dual-gate FET transistors 107-110. An input periodic signal to be phase shifted is received by phase shifter/vector modulator 101 at input port 111. Input port 111 couples the input signal to one end of a first lumped delay line 103. The other end of the first lumped delay line 103 is terminated by a terminating resistance 113.

First delay line 103 is comprised of a number of individual delays 115 coupled in series and separated by a number of taps 117. Each tap 117 on first delay line 103 is connected to the second gate 118-121 of the corresponding dual-gate FET transistor 107-110 respectively. The source 122-125 of each FET is connected to ground 127.

Second delay line 105 is comprised of a number of individual delays 129 coupled in series and separated by a number of taps 131. The signal delay provided by each delay 115 in the first delay line 103 and each delay 129 in the second delay line 105 is different. Each tap 131 on the second delay line 105 is connected to a drain 138-141 of the corresponding FET 107-110 such that taps 131 and 117 share one FET and form a vector channel 142-145. Precise selection of delay times in each delay line 103 and 105 provide 90° vector separation at the chosen center frequency of operation. The delayed and phase shifted signals in each vector channel are summed at the outputs 147 and 149.

In order to control the phase of the signal at the outputs 147 and 149, the magnitude of the vector generated in each vector channel 142-145 may be adjusted by application of a control voltage $V_{A-D}$ to a first gate 150-153 of each FET 107-110. By properly adjusting the applied voltage V to each FET and vector channel, a periodic signal at the output ranging in phase from 0° to 360° can be theoretically generated.

Figure 2:
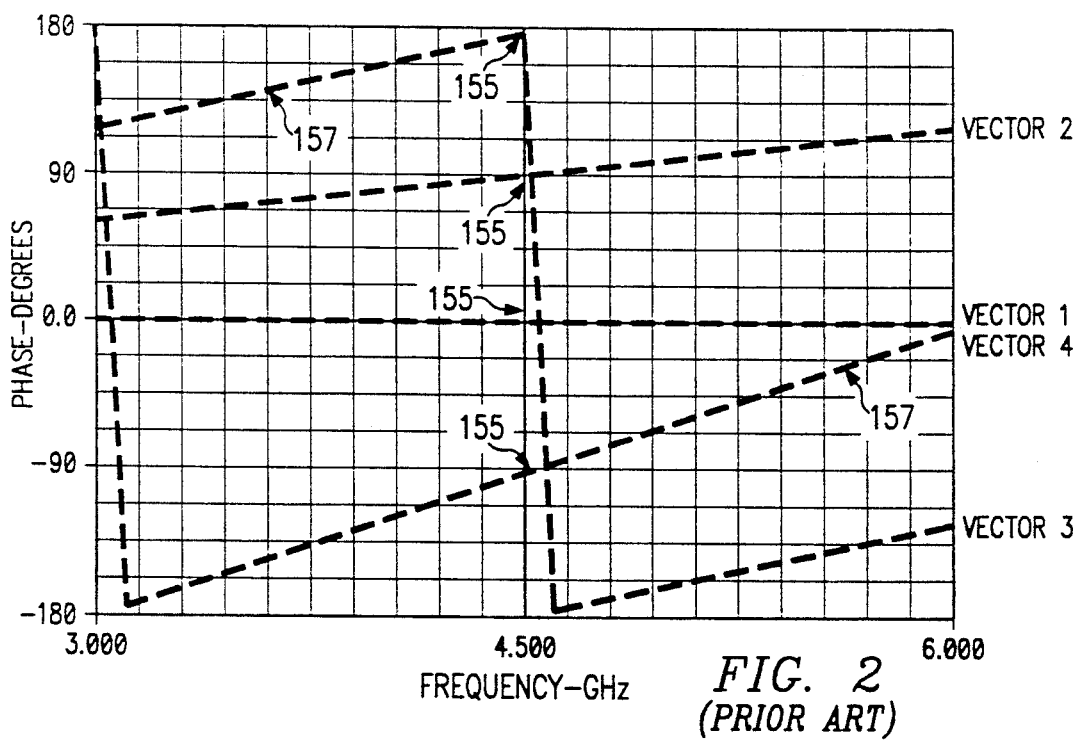
FIG. 2 is a vector phase angle versus frequency plot of the operating characteristics of the prior art Strid vector modulator shown in FIG. 1.

Referring now to FIG. 2, there is shown the frequency response characteristics of the prior art Strid vector modulator 101 shown in FIG. 1. In particular, FIG. 2 discloses that the Strid prior art modulator has an extremely narrow bandwidth over which near-90° vector phase separation is maintained. For example, at a given center frequency, for example 4.50 GHz, the delays for each delay line can be precisely chosen to provide exactly 90° phase shift per vector channel as shown generally at 155. However, as the frequency of operation drifts away from the chosen center frequency, the frequency response of the vector channels becomes severely degraded as generally indicated at 157 causing each channel to lose its 90° phase shift.

Thus, the Strid modulator is unable, especially in broadband systems applications, such as phased array antennas, where precise phase shifting over a wide frequency range is essential, to maintain accurate phase control (for steering of the beam) and suppress collateral phase effects (sidelobe generation).

Figure 3:
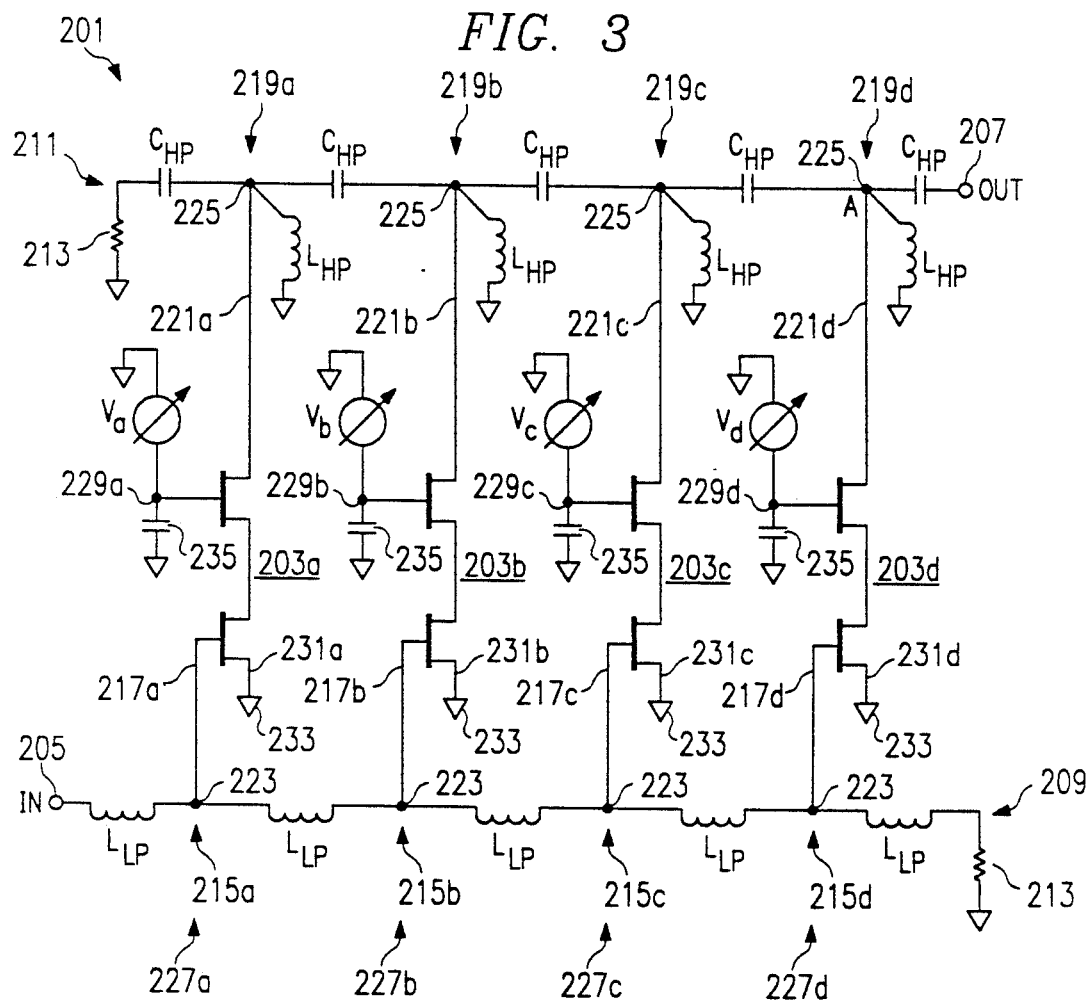
FIG. 3 is a schematic diagram of a vector modulator in accordance with the teachings of the invention.

Referring now to FIG. 3, there is shown a broadband vector modulator 201 of the present invention. The vector modulator is generally comprised of a number of dual-gate or cascade connected MESFETs 203a-203d, an input port 205, an output port 207 and a low pass and high pass filter network, 209 and 211 respectively. The MESFETs 203a-203d are coupled to the low pass and high pass filter networks at a number of taps, 223 and 225.

Input port 205 of the vector modulator 201 is configured to receive a periodic signal to be phase shifted. Low pass filter network 209 is coupled to the input port 205 and is terminated by a terminating resistance 213. A number of low pass filters 215a-215d corresponding to each MESFET 203a-203d are coupled in series between the input port 205 and the terminating resistance 213 to form the low pass filter network 209 (first artificial transmission line).

Figure 4A:
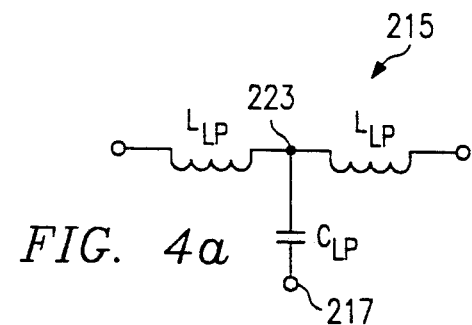
FIGS. 4A and 4B are schematic circuit diagrams for the low pass and high pass filter sections of the vector modulator shown in FIG. 3.

As shown in FIGS. 3 and 4A, each low pass filter 215a-215d is comprised of a "T"-shaped LC low pass filter circuit having a pair of inductances $L_{LP}$ connected in series to form the arms of the "T" coupled at tap 223 to the parasitic capacitance (not shown in FIG. 3) of the first gate electrode 217a-217d of each associated MESFET 203a-203d. In forming each LC low pass filter 215a-215d, two criteria are important.

First, the impedance of the low pass filter network 209 (first artificial transmission line) should match the characteristic impedance the transmission line coupled to the input port 205 (generally 50 ohms). Second, each low pass filter 215a-215d of the low pass filter network 209 should provide a phase shift of minus 180°/N, wherein N is the number of MESFETs 203 utilized in the vector modulator 201. For example, if four MESFETs are used, as shown in FIG. 3, each low pass filter 215a-215d should be configured to provide minus 45° of phase shift.

The equations for the inductances $L_{LP}$ and parasitic capacitances of the MESFET ($C_{LP}$, not shown) that will provide minus 45° of phase shift and match a 50 ohm transmission line for the low pass filter network 209 are given below:

$$L_{LP} = (50 * cos(45°) - 50)/(w * sin(45°); \text{ and} \quad (1)$$

$$C_{LP} = 2 * L_{LP}/(2500 + w^2 L_{LP}); \quad (2)$$

wherein: w is the center frequency of the broadband signal; and 2500 represents square of the characteristic impedance (50 ohms) of the transmission line. It will, of course, be understood that the vector modulator 201 of the present invention is not limited to a 50 ohm match or minus 45° phase shift, but may be configured in any other manner according to equations (1) and (2) above. Incorporation of the MESFET parasitic capacitance into each low pass filter 215 of the low pass filter network 209 reduces the number of components in the vector modulator 201, enabling the modulator to be more efficiently and consistently manufactured monolithically.

Output port 207 of the vector modulator 201 is configured to output a phase shifted version of the input periodic signal. High pass filter network 211 is coupled to the output port 207 and is terminated by a terminating resistance 213. A number of high pass filters 219a-219d corresponding to each MESFET 203a-203d are coupled in series between the output port 207 and the terminating resistance 213 to form a second artificial transmission line.

Figure 4B:
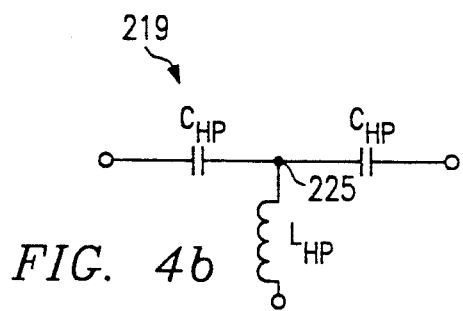

As shown in FIGS. 3 and 4B, each high pass filter 219a-219d is comprised of a "T"-shaped LC high pass filter having a pair of capacitances $C_{HP}$ connected in series to form the arms of the "T" and coupled at tap 225 to a shunt inductance $L_{HP}$ and the drain electrode 221a-221d of each associated MESFET. In forming each LC high pass filter 219, the same two criteria of proper impedance match and phase shift are important.

First, the impedance of the high pass filter network 211 (second artificial transmission line) should match the characteristic impedance of the transmission line coupled to the output port 207 (generally 50 ohms). Second, each high pass filter 219 of the filter network 211 should provide a phase shift of 180/N°, wherein N is the number of MESFETs 203a-203d utilized in the vector modulator 201. For example, if four MESFETs are used, as shown in FIG. 3, each high pass filter 219 should be configured to provide 45° of phase shift.

The equations for the capacitances $C_{HP}$ and inductance $L_{HP}$ that will provide 45° of phase shift and match a 50 ohm transmission line are given below:

$$C_{HP} = (cos(45°) + 1)/(50 * w * sin(45°); \text{ and} \quad (3)$$

$$L_{HP} = 1250 * C_{HP} + 1/(2 * w^2 C_{HP}); \quad (4)$$

wherein: w is the center frequency of the broadband signal; and 1250 represents ½ the square of the characteristic impedance (50 ohms) of the transmission line. It will, of course, be understood that the vector modulator 201 of the present invention is not limited to a 50 ohm match or 45° phase shift, but may be configured in any other manner according to equations (3) and (4) above.

The taps 223 and 225 of each low pass filter section 215a-215d and high pass filter section 219a-219d, respectively, are coupled through the corresponding MESFET 203a-203d in the vector modulator 201 to form a vector channel 227a-227d. In the configuration shown in FIG. 3, each vector channel 227 provides 90° of phase shift from summing the two 45° phase shifts provided by each included filter section. The taps for the low pass and high pass filter sections, 223 and 225 respectively, are coupled to the first gate electrode 217a-217d and drain electrode 221a-221d respectively of the corresponding MESFET 203a-203d. A second gate electrode 229a-229d of each MESFET 203a-203d is coupled to a variable DC bias voltage source $V_{a-d}$ to adjust the amplification of the signal in each vector channel 227a-227d. The vector modulator 201 circuit is completed by coupling the source electrode 231a-231d to ground 233. Also, a shunt capacitor 235 is coupled to each second gate electrode 229a-229d.

In the operation of the vector modulator 201, a signal incident on the input port 205 travels along the low pass filter network 209 (first artificial transmission line) toward the terminating resistor 213. The signal is phase shifted by minus 45° as it passes through each low pass filter section 215. At each tap 223, the signal is sampled by the associated MESFET 203. The sampled signal is selectively amplified according to the applied variable DC bias voltages $V_{a-d}$ and injected into the tap 225 for the corresponding high pass filter section 219. At this point the signal is phase shifted. As the shifted signal propagates along the high pass filter network 211 (second artificial transmission line) toward the output port 207, the signal is added to the shifted signals injected at each successive tap 225.

Figure 5:
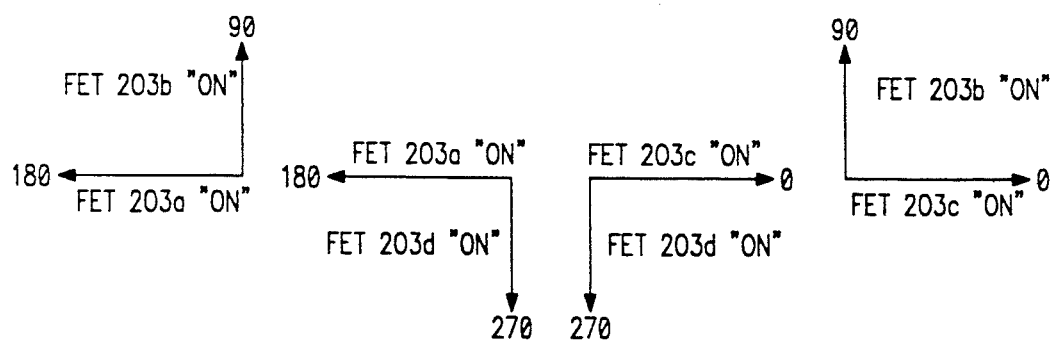
FIG. 5 illustrates drawings of vectors generated by the vector modulator of FIG. 3 in several modes of operation.

The amplified and shifted signals in each vector channel 227a-227d can be considered to be mathematical vectors. As shown in FIG. 5, by selectively turning the MESFETs 203a-203d "on" and "off" and adjusting the MESFET bias voltage $V_{a-d}$, an output signal of any phase from 0° to 360° can be generated.

Figure 6:
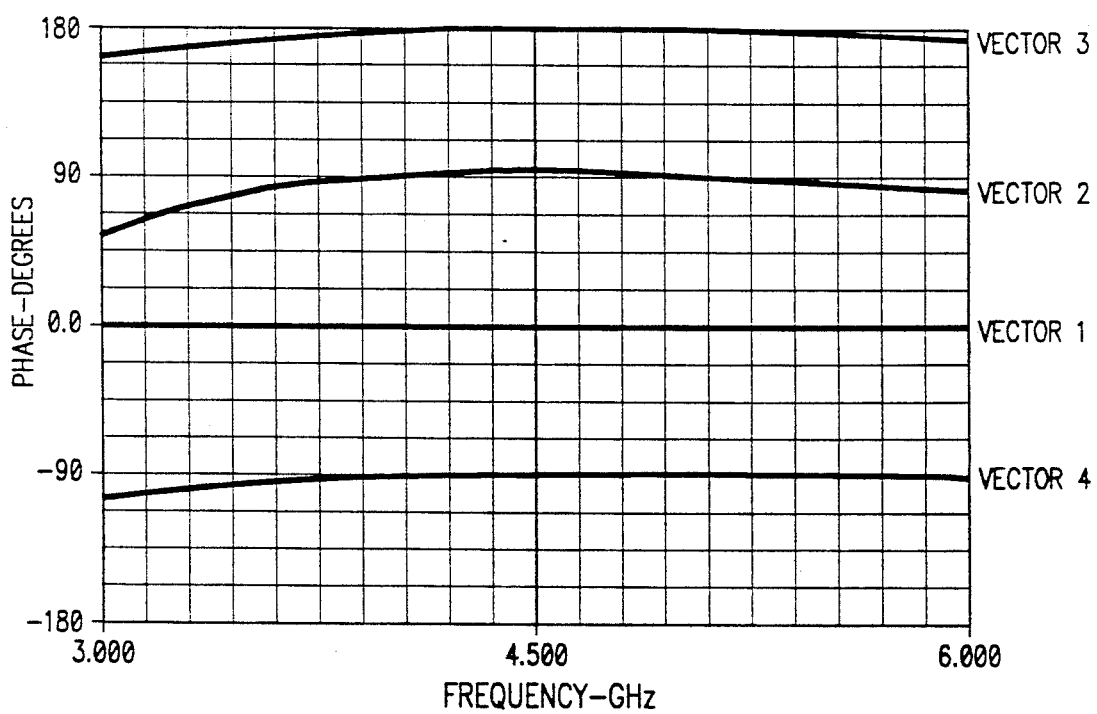
FIG. 6 is a vector phase angle versus frequency plot of the operating characteristics of the vector modulator of the present invention as shown in FIG. 3.

Referring now to FIG. 6, there is shown the frequency response characteristics of the vector modulator 201 of the present invention. Unlike the prior art vector modulator (see FIGS. 1 and 2), the vector modulator 201 maintains near-90° phase separation in each vector channel over a wide bandwidth. The use of a combination low pass and high pass filter networks, 209 and 211 respectively, rather than delay lines as in the prior art, reduces the frequency sensitivity because the two filters have nearly identical roll-off characteristics. Thus, the transit times traveled by the input signal through each vector channel are nearly identical over a broad bandwidth. The bandwidth of the vector modulator is limited only by the frequency response (roll-off) of each included filter section rather than by the frequency dependant signal delayers of the prior art. The vector modulator of the present invention can thus provide a bandwidth of approximately 30% with a ±5° phase error in each vector channel.

Although a preferred embodiment of the invention has been illustrated in the accompanying Drawings and described in the foregoing Detailed Description, it will be understood that the invention is not limited to the embodiment disclosed but is capable of numerous rearrangements and modifications of parts and elements without departing from the scope of the invention as set forth in the following claims.

I claim:

1. An analog phase shifter for shifting the phase of an input periodic signal by any selected angle between 0° and 360° comprising:
   a first artificial transmission line having a plurality of substantially matched low pass filter sections connected in series, each low pass filter section shifting the phase of a signal on the first artificial transmission line by a predetermined amount, an end of the first artificial transmission line terminating as an input port for the input periodic signal;
   a second artificial transmission line having a plurality of substantially matched high pass filter sections connected in series, each high pass filter section shifting the phase of a signal on the second artificial transmission line by a predetermined amount, an end of the second artificial transmission line terminating as an output port for a phase-shifted version of the input periodic signal;
   a transistor corresponding to each pair of low pass and high pass filter sections, each said transistor having a first electrode coupled to the corresponding low pass filter section and a second electrode coupled to the corresponding high pass filter section; and
   bias means coupled to each transistor for individually adjusting the conductivity of each transistor to provide a selected angle of phase shift at each transistor for the input signal.

2. The analog phase shifter as set forth in claim 1 wherein the transistors are field effect transistors (FET).

3. The analog phase shifter as set forth in claim 2 wherein the FETs are MESFETs.

4. The analog phase shifter according to claim 2 wherein each FET has a parasitic capacitance associated with the first electrode of the FET and each low pass filter section includes the parasitic capacitance of the FET to which it is coupled.

5. The analog phase shifter as set forth in claim 1 wherein the bias means for individually adjusting comprises a plurality of independently variable DC bias voltages, each DC bias voltage coupled to a third electrode of each transistor such that adjustment of each DC bias voltage produces a change in the phase shift of the input signal at the output port.

6. The analog phase shifter as in claim 1 wherein the first electrode of a transistor includes inherent capacitance and each of the low pass filter sections comprises an inductor connected at a low pass filter tap to the first electrode.

7. The analog phase shifter as in claim 1 wherein each of the high pass filter sections comprises:
   a capacitor connected at a high pass filter tap to the second electrode of a transistor; and
   an inductor shunt connected between the high pass filter tap and ground.

8. An analog phase shifter and vector modulator for shifting a phase of an input signal by any angle from 0° to 360° comprising:
   an input port for receiving the input signal at a first phase, the phase of the input signal to be shifted by a preselected angle;
   a plurality of transistors, each transistor having a gate and a drain;
   a first plurality of inductors individually connecting the gate of one transistor to the gate of an electrically adjacent transistor of the plurality of transistors and an inductor connecting the input port to the gate of a first one of the transistors;
   an output port;
   a plurality of capacitors individually connecting the drain of one transistor to the drain of an electrically adjacent transistor of the plurality of transistors and a capacitor connecting the output port to the drain of a last one of the transistors; and
   a second plurality of inductors individually coupling the drain of each transistor to a ground; and
   bias means connected to each of the plurality of transistors for individually adjusting the conductivity of a transistor to shift the phase of the input signal at each transistor.

9. The analog phase shifter according to claim 8 wherein each of the transistors has a second gate and the bias means for adjusting comprises a variable DC bias voltage corresponding to each transistor for controlling the amplification gain of the transistor so as to control the phase shift of the input signal by the preselected angle at the output port.

10. The analog phase shifter according to claim 8 wherein each of the transistors are field effect transistors (FET).

11. The analog phase shifter according to claim 8 wherein each of the transistors are MESFETs.

12. An analog vector modulator, comprising:
   an input port for receiving a signal to be phase shifted;

a first plurality of inductors series connected at a plurality of first filter taps, the first plurality of inductors connecting the input port to a first terminating resistance;

an output port for providing a phase shifted version of the signal received at the input port;

a plurality of capacitors series connected at a plurality of second filter taps, the plurality of capacitors connecting the output port to a second terminating resistance;

a plurality of transistors each having a first electrode including a parasitic capacitance coupled to one of the plurality of first filter taps and a second electrode coupled to a corresponding one of the plurality of second filter taps;

a plurality of bias means each providing a variable bias voltage applied to one of the plurality of transistors to vary the conductivity of the transistor and alter the phase of the input signal at the output port.

13. The analog vector modulator as in claim 12 wherein each transistor includes a third electrode coupled to one of the plurality of bias means.

* * * * *